United States Patent
Hurley et al.

(10) Patent No.: US 9,536,556 B2
(45) Date of Patent: Jan. 3, 2017

(54) LASER SUBASSEMBLY METALLIZATION FOR HEAT ASSISTED MAGNETIC RECORDING

(71) Applicant: Seagate Technology LLC, Cupertino, CA (US)

(72) Inventors: Jon Paul Hurley, Bloomington, MN (US); Bernard W. Bell, Lafayette, CO (US); Steven Harlow Anderson Axdal, Cottage Grove, MN (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 0 days.

(21) Appl. No.: 14/987,083

(22) Filed: Jan. 4, 2016

(65) Prior Publication Data

US 2016/0118075 A1   Apr. 28, 2016

Related U.S. Application Data

(63) Continuation of application No. 13/797,839, filed on Mar. 12, 2013, now Pat. No. 9,227,257.
(Continued)

(51) Int. Cl.
*G11B 5/10* (2006.01)
*G11B 7/127* (2012.01)
(Continued)

(52) U.S. Cl.
CPC .............. *G11B 7/127* (2013.01); *B23K 1/0008* (2013.01); *B23K 35/262* (2013.01); *B23K 35/3013* (2013.01); *C22C 5/02* (2013.01); *C22C 13/00* (2013.01); *G11B 5/105* (2013.01); *G11B 5/6005* (2013.01); *G11B 13/04* (2013.01); *H01L 23/488* (2013.01); *H01L 24/15* (2013.01); *H01S 5/0216* (2013.01); *B23K 35/24* (2013.01); *G11B 5/012* (2013.01); *G11B 5/6088* (2013.01); *G11B 2005/0021* (2013.01);
(Continued)

(58) Field of Classification Search
None
See application file for complete search history.

(56) References Cited

U.S. PATENT DOCUMENTS

| 6,153,503 A | 11/2000 | Lin et al. |
| 2007/0131734 A1 | 6/2007 | Hosseini et al. |

(Continued)

FOREIGN PATENT DOCUMENTS

WO   WO 2004004003   1/2004

OTHER PUBLICATIONS

File History for U.S. Appl. No. 13/797,839, 162 pages.
(Continued)

*Primary Examiner* — Brian Butcher
(74) *Attorney, Agent, or Firm* — Hollingsworth Davis, LLC

(57) ABSTRACT

A heat assisted magnetic recording (HAMR) assembly includes a slider, a laser diode and solder connections between the laser diode and the slider. The solder connections mechanically and electrically attach the laser diode to the slider. Each solder connection has a total volume per unit area (i.e., height) of less than or equal to about 15 μm. The solder connections have a first intermetallic zone adjacent to the laser diode, a second intermetallic zone adjacent to the slider, and a eutectic zone of eutectic material between the first and second intermetallic zones. The eutectic zone occupies greater than or equal to about 35% of the total volume per unit area of the solder connection.

20 Claims, 13 Drawing Sheets

Related U.S. Application Data

(60) Provisional application No. 61/637,502, filed on Apr. 24, 2012.

(51) Int. Cl.

| | | |
|---|---|---|
| *B23K 1/00* | (2006.01) | |
| *G11B 13/04* | (2006.01) | |
| *H01L 23/488* | (2006.01) | |
| *H01S 5/02* | (2006.01) | |
| *H01L 23/00* | (2006.01) | |
| *G11B 5/105* | (2006.01) | |
| *B23K 35/26* | (2006.01) | |
| *B23K 35/30* | (2006.01) | |
| *C22C 5/02* | (2006.01) | |
| *C22C 13/00* | (2006.01) | |
| *B23K 35/24* | (2006.01) | |
| *H01L 21/60* | (2006.01) | |
| *G11B 5/012* | (2006.01) | |
| *G11B 5/60* | (2006.01) | |
| *G11B 5/00* | (2006.01) | |

(52) U.S. Cl.
CPC ............. *H01L 2021/60022* (2013.01); *H01L 2224/16225* (2013.01); *H01L 2225/06517* (2013.01); *H05K 2201/10674* (2013.01)

(56) References Cited

U.S. PATENT DOCUMENTS

2011/0157738 A1  6/2011  Shimazawa et al.
2012/0211793 A1  8/2012  Bergmann et al.
2013/0037940 A1  2/2013  Chen et al.

OTHER PUBLICATIONS

DfR Solutions, "Processing and Reliability Issues for Eutectic AuSn Solder Joints", 41$^{st}$ International Symposium on Microelectronics (IMAPS 2008) Proceedings, Nov. 2008, p. 909-916.

Jittinorasett, "UBM Formation on Single Die/Dice for Flip Chip Applications", Thesis submitted to Faculty of Virginia Polytechnic Institute and State University, Aug. 1999, pp. 1-80.

Khan et al., "Three Chips Stacking with Low Volume Solder Using Single Re-Flow Process", Electronic Components and Technology Conference, 2010, pp. 884-888.

Klein et al., "Behaviour of Platinum as UBM in Flip Chip Solder Joints", Electronic Components and Technology Conference, 2000, pp. 40-45.

Lin et al., "Electromigration in Ni/Sn Intermediate Micro Bump Joint for 3D IC Chip Stacking", Electronic Components and Technology Conference, 2011, pp. 351-357.

Liu et al., "Design and Implementation of Metallization Structures for Epi-Down Bonded High Power Semiconductor Lasers", Electronic Components and Technology Conference, 2004, pp. 798-806.

Pittroff et al., "Flip Chip Mounting of Laser Diodes with Au/Sn Solder Bumps: Bumping, Self-Alignment and Laser Behavior", Electronic Components and Technology Conference, 1997, pp. 1235-1241.

Yu et al., "Study of 15um Pitch Solder Microbumps for 3D IC Integration", Electronic Components and Technology Conference, 2009, pp. 6-10.

"UBM, RDL and Micro Bumps", printed from http://www.jvsemi.com/applications/wafer-level-packaging/ubm-rdl-and-micro-bumps on Feb. 28, 2013.

LASER SUBASSEMBLY METALLIZATION FOR HEAT ASSISTED MAGNETIC RECORDING

RELATED PATENT DOCUMENTS

This application is a continuation of U.S. patent application Ser. No. 13/797,839, filed on Mar. 12, 2013, which claims the benefit of provisional Patent Application Ser. No. 61/637,502 filed on Apr. 24, 2012, which are hereby incorporated herein by reference in their entireties.

SUMMARY

Embodiments discussed herein involve metallization for solder connections between an electronic component and a substrate.

Some embodiments include a heat assisted magnetic recording (HAMR) assembly that includes a slider, a laser diode and solder connections between the laser diode and the slider. The solder connections mechanically and electrically attach the laser diode to the slider. Each solder connection has a total volume per unit area (i.e., height) of less than or equal to about 15 μm. The solder connections have a first intermetallic zone adjacent to the laser diode, a second intermetallic zone adjacent to the slider, and a eutectic zone of eutectic material between the first and second intermetallic zones. The eutectic zone occupies greater than or equal to about 35% of the total volume per unit area of the solder connection.

According to some aspects, the eutectic material is an Sn-containing eutectic material. For example, the eutectic material may comprise Sn and Ag or Au and Sn. In some implementations, the eutectic material is about 96.5 wt. % Sn and about 3.5 wt. % Ag. In some implementations, eutectic material is about 90 wt. % Au and about 10% Sn.

In some solder connections, the volume per unit area is less than or equal to about 10 μm, less than or equal to about 8 μm, or even less than or equal to about 4 μm.

Some embodiments are directed to an assembly that includes a substrate, an electronic component, and solder connections between the substrate and the electronic component. The solder connections mechanically and electrically attach the electrical component to the substrate. At least one of the solder connections has total volume per unit area of less than or equal to about 15 μm and has a first intermetallic zone adjacent to the electronic component, a second intermetallic zone adjacent to the substrate, and a eutectic zone of eutectic material between the first and second intermetallic zones. The eutectic zone occupying greater than or equal to about 35% of the total volume per unit area of the solder connection.

Some embodiments involve a laser subassembly that includes a laser diode. A metallization stack is disposed on the laser diode. The metallization stack includes a metallization wetting layer having a thickness less than about 1000 Å and a Pt layer having a thickness from about 300 Å to about 3000 Å. The metallization stack is configured to provide a solder connection having total volume per unit area of less than or equal to about 15 μm and having a first intermetallic zone adjacent to the electronic component, a second intermetallic zone adjacent to the substrate, and a eutectic zone of eutectic material between the first and second intermetallic zones, the eutectic zone occupying greater than or equal to about 35% of the total volume per unit area of the solder connection.

In some implementations, the metallization stack includes an Ni layer having a thickness from about 300 Å to about 3000 Å.

In some implementations, the metallization stack further comprises a Cu layer having a thickness less than about 1000 Å.

In some implementations, the metallization stack further comprises an Ti layer adjacent to at least one of an N and P-metal of the laser diode. For example, the Ti layer may have a thickness from about 100 Å to about 500 Å or between about 200 Å to about 300 Å.

Some embodiments involve a subassembly the includes an electronic component and a metallization stack on the electronic component. The metallization stack includes a metallization wetting layer having a thickness less than about 1000 Å and a Pt layer having a thickness from about 300 Å to about 3000 Å. The metallization stack is configured to provide a solder connection having total volume per unit area of less than or equal to about 15 μm and having a first intermetallic zone adjacent to the electronic component, a second intermetallic zone adjacent to the substrate, and a eutectic zone of eutectic material between the first and second intermetallic zones, the eutectic zone occupying greater than or equal to about 35% of the total volume per unit area of the solder connection.

Some embodiments are directed to a method for forming solder connections. Contacts of an electronic component are aligned with contacts of a substrate. At least one of the electronic component contacts and the substrate contacts comprise a metallization stack that includes an Au layer having a thickness less than about 1,000 Å and a Pt layer having a thickness from about 300 Å to about 3000 Å. The electronic component contacts and the substrate contacts are reflow soldered to form solder connections between the electronic component and the substrate. Each of the solder connections have total volume per unit area of less than about 15 μm and have a first intermetallic zone adjacent to the electronic component, a second intermetallic zone adjacent to the substrate, and a eutectic zone of a eutectic material between the first and second intermetallic zones and occupying greater than or equal to about 35% of the total volume per unit area of the solder connection. In some configurations, the metallization further comprises a layer of Ti having a thickness of between about 100 Å and 500 Å.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

For heat assisted magnetic recording (HAMR), electromagnetic radiation, for example, visible, infrared or ultraviolet light, is directed onto a surface of the recording media to raise the temperature of a localized area of the media to facilitate switching of the magnetization of the heated area. Recent designs of HAMR recording heads include a thin film waveguide on a slider to guide light to the recording media for localized heating of the recording media. A near-field transducer positioned at the air bearing surface of a recording head can be used to direct the electromagnetic radiation to a small spot on the recording media.

In a HAMR storage device constructed according to a particular embodiment, a laser diode chip is positioned on the slider. Precise alignment of the laser diode output and the waveguide is achieved by using laser diode beds (also referred to as cavities or pockets) with specially designed features, such as stoppers and steps. In many cases, the laser is securely mounted electrically and mechanically to the slider in precise alignment with the waveguide and/or other optical components using a eutectic solder to electrically and mechanically couple contacts on the laser to contacts on the slider. For example, the contacts on the laser, submount, and/or slider may be configured for surface mount applications. Soldering the laser to the slider may be accomplished by reflow or wave soldering contacts on the laser to contacts on the slider in such a way that the laser is aligned with other optical components on the slider during the reflow soldering process.

Figure 1:
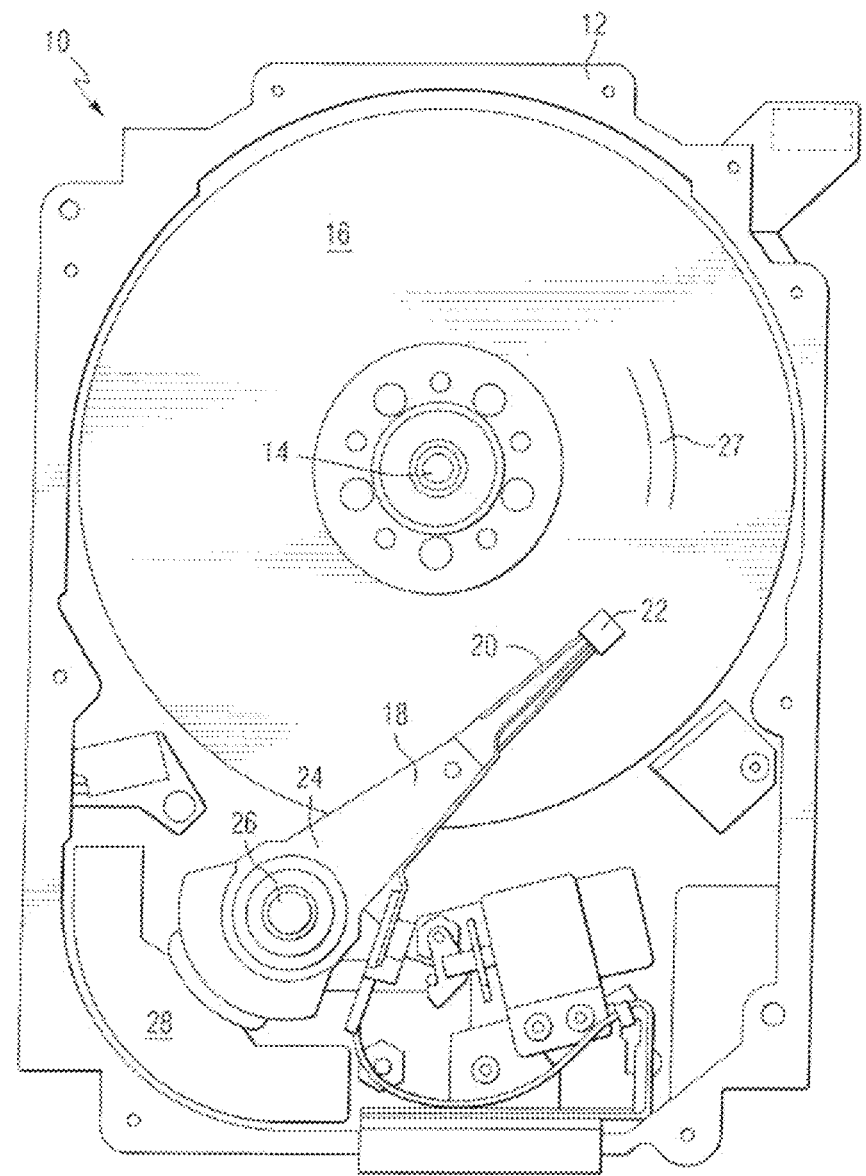
FIG. 1 is a perspective view of a magnetic recording device according to an example embodiment.

FIG. 1 is a pictorial representation of a data storage device in the form of a disk drive 10 that can include a slider constructed in accordance with embodiments described below. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired track 27 of the disc 16. The actuator motor 28 is regulated by a controller, which is not shown in this view.

Figure 2:
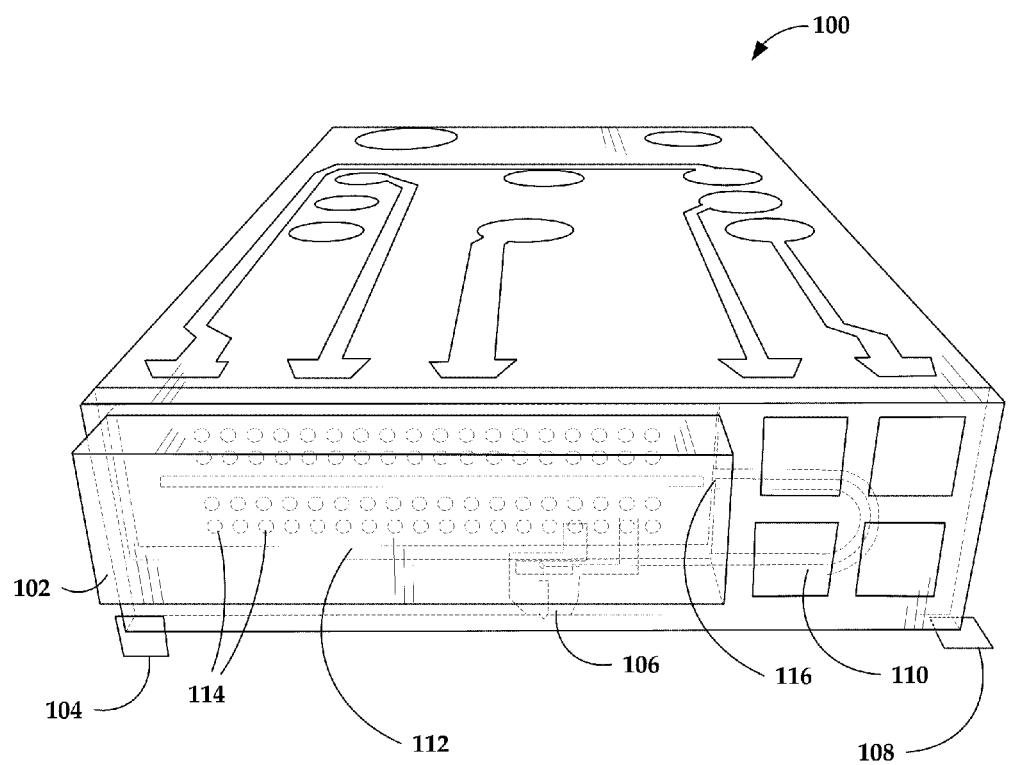
FIG. 2 illustrates a perspective view of various features of a laser-in-slider device 100 according to an example embodiment.

In reference now to FIG. 2, a perspective view illustrates various features of a laser-in-slider device 100 that includes a laser soldered to a slider in accordance with approaches discussed herein. In this example, an edge-emitting laser diode 102 is integrated into a trailing edge surface 104 of the slider 100. In this example, the laser diode may be positioned within a cavity 112 on the slider 100 and soldered to the slider. Solder bump contacts 114 having metallization stacks as discussed herein are used to make electrical connection between the laser and the slider. For example, in the embodiments discussed below, the solder contacts with metallization stacks may be disposed on the laser and/or on the slider.

The laser diode 102 is proximate to a HAMR read/write head 106, which has one edge on an air bearing surface 108 of the slider 100. The air bearing surface 108 is held proximate to a moving media surface (not shown) during device operation. The laser diode 102 provides electromagnetic energy to heat the media surface at a point near to the read/write head 106. Optical coupling components, such as a waveguide 110, and/or a near field transducer, are formed integrally within the slider device 100 to deliver light from the laser 102 to the media.

In this example, the laser diode 102 is approximately 500 µm long, 125 µm wide (vertical dimension in the orientation of FIG. 1), and 100 µm tall. The laser diode 102 is recessed in a cavity 112 formed in the trailing surface 104 of the slider 100. This cavity 112 may be formed such that there is a gap (e.g., approximately 5-10 µm in width) surrounding the laser 102 to allow for tolerance adjustment during assembly. The bottom of the cavity includes contacts 114 that interface with corresponding contacts formed on the laser 102. The contacts 114 facilitate bonding the laser 102 to the slider 100, provide electrical connectivity for the laser 102, and may provide other functions (e.g., heat sinking the laser 102).

During assembly, the laser 102 is precisely aligned with the waveguide 110 to ensure sufficient energy is delivered to the media. At an optical coupling region, the laser 102 includes an output facet that is aligned to launch light into an input optical coupler 116 of the waveguide 110. The input optical coupler 116 may be formed in a sidewall of the cavity 112. In one embodiment, the cavity 112 may include a narrow gap (e.g., approximately 0.25-1.0 µm) between the input optical coupler 116 and the output facet of the laser 102 to facilitate alignment therebetween.

The contacts 114 that are used to electrically and mechanically connect the laser 102 to the slider 100 facilitate low volume per unit area soldered connections that have a maximum volume per unit area of less than about 15 µm. The low volume/area and fine pitch of the soldered connections at contacts 114 serves to provide 1) low resistance to the current required to operate the laser, 2) mechanical connection between the laser 102 and the slider 100; and 3) when used in conjunction with stop pegs (not shown in FIG. 2), passive optical alignment between the laser 102 and input optical coupler 116 waveguide 100. Although a laser in a slider cavity is shown in the example of FIG. 2, the solder connections discussed herein are suitable for any type of laser-slider assembly or electronic component-substrate assembly for which low volume per surface area connections are used.

Fine pitch, low volume/area solder connections can suffer from reliability issues that arise when the contact metallization (also referred to herein as "under bump metallization" or UBM) consumes the solder and forms large intermetallic zones during the reflow process. The large intermetallic zones form when metals in the solder (e.g., Sn) react with the metals in the UBM, a process that can take place slowly even at room temperature for certain metal combinations and accelerates during soldering. The intermetallic zones are mechanically fragile, significantly impacting the structural integrity of the solder connection. As more of the Sn in the solder is consumed into the intermetallic zones, the solder connection is becomes more unstable. Some percentage of eutectic material needs to remain in an eutectic zone in the solder connection to achieve a structurally sound connection. The eutectic material is a mixture of two or more component materials in a proportion that their combined melting point is lower than either component by itself.

The proportion of the solder in the solder connection that is consumed by the UBM and/or the thickness of the eutectic region can be controlled and limited using appropriate materials, thicknesses and/or arrangement of layers in the UMB. In various embodiments discussed below, the solder connections are made between contacts on a substrate and contacts on an electronic device, wherein the contacts comprise a UBM. The soldered connections have a volume/area of less than or equal to about 15 µm, less than or equal to about 10 µm, less than or equal to about 8 µm or less than or equal to about 4 µm. The types and thicknesses of the metal layers of the (pre-soldered) metallization stack disposed under the micro bumps are selected to provide a soldered connection that includes a eutectic zone of the of the (post-soldered) solder connection comprising eutectic material and having volume/area greater than or equal to about 35%. This eutectic zone maintains the intermetallic zones of the (post-soldered) solder connection to a volume/area that is less than or equal to about 65%.

Figure 3A:
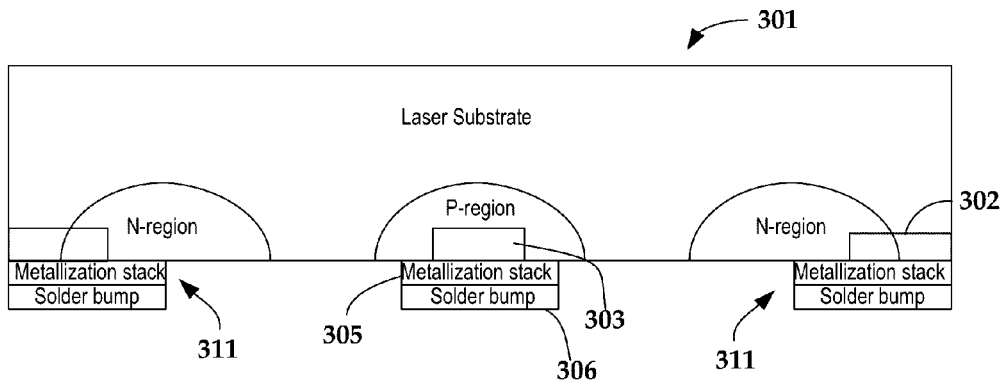
FIGS. 3A-3C illustrate a solder bump contacts for a laser attached to a slider in accordance with embodiments described herein.

FIG. 3A presents a simplified view of a laser diode 310 before it is soldered to a slider in accordance with embodiments described herein. The laser diode 310 comprises a substrate with N- and P-type semiconductor regions. To facilitate electrical contact between the semiconductor regions of the laser diode 310, N-metal stacks 302 are formed on the on the N-type semiconductor regions and P-metal stacks 303 are formed on the P-type semiconductor regions of the laser diode 310. The laser diode 310 includes contacts 311, wherein each contact 311 comprises a metallization stack (UBM) 305 and a solder bump 306. The metallization stacks 305 are formed on the N- or P-metal stacks and the solder bumps 306 are formed on the metallization stacks 305. In a particular example, at their base (or largest cross sectional area) the solder bumps 306 have a maximum (circular) surface area of less than about 300 µm$^2$ and/or a volume of less than about 1000 µm$^3$. In some embodiments, the solder bumps may comprise a Sn-containing solder. For example, in one implementation, the solder bumps may have a relatively high Sn content solder, e.g., a solder comprising Sn greater than about 90 wt. %, such as Sn wt. 96.5 wt. %/Ag 3.5 wt. %. In other implementations, the solder used for the solder bumps may have a relatively low solder content, such as Au 90 wt. %/Sn 10 wt. %. In various embodiments, the solder used in the solder bumps 306 may have a melting temperature in a range of about 220° C. to about 250° C. Using a lower melting temperature solder, e.g., Sn wt. 96.5 wt. %/Ag 3.5 wt. %. may be useful to protect heat sensitive components, such as the read sensor and/or other components that have been fabricated on the slider prior to laser installation.

Each contact 311 comprises a metallization stack 305 configured to produce a post-soldered solder connection that comprises eutectic zone of eutectic material in at least about 35% of the post-soldered volume/area (i.e., height) of the solder connection. The eutectic zone is disposed between first and second intermetallic zones in the soldered connection. A eutectic zone that occupies at least 35% of the post-soldered volume/area of the solder connection limits the volume/area of the intermetallic zones to no more than about 65% of the total volume/area of the solder connection. This ratio of intermetallics to eutectic material in the solder connection produces a mechanically robust solder connection. In some configurations, the eutectic material may be an Sn-containing eutectic material.

Figure 3B:
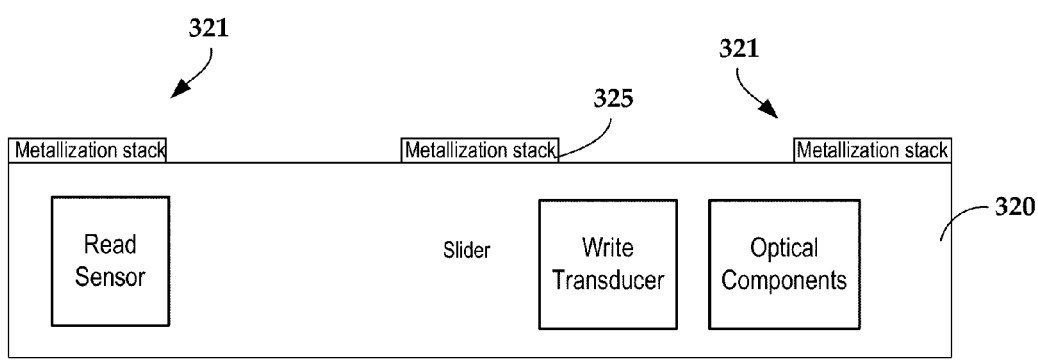

FIG. 3B illustrates a slider 320 that may incorporate one or more temperature sensitive components, such as read sensor, a write transducer, and optical components. The slider 320 includes contacts 321 configured to directly bond to corresponding contacts 311 of the laser subassembly 310. Each contact 321 comprises a metallization stack 325 formed on the slider. The contacts 321 are compatible to mate with the laser contacts 311, and in a particular embodiment have a base cross sectional (circular) area of less than about 300 µm$^2$. The metallization stack 325 is configured to produce a post-soldered connection with a compatible mating laser contact that includes a eutectic zone of eutectic material having a thickness (i.e., volume/area) of greater than or equal to about 35% of the total post-soldered thickness (i.e., volume/area) of the solder connection. The intermetallic zones have a volume/area limited to no more than about 65% of the total volume/area of the solder connection. This ratio of intermetallics to eutectic material produces a mechanically robust solder connection.

Prior to the reflow solder process, solder bumps may be disposed on one or both metallization stacks of the mating contacts. In the example provided in FIGS. 3A and 3B, solder bumps are shown disposed on the metallization stacks 305 of the laser 301. Alternatively, solder bumps may be disposed on the metallization stacks 325 of the slider or may be disposed on both the metallization stacks 305 of the laser and the metallization stacks 325 of the slider.

Figure 3C:
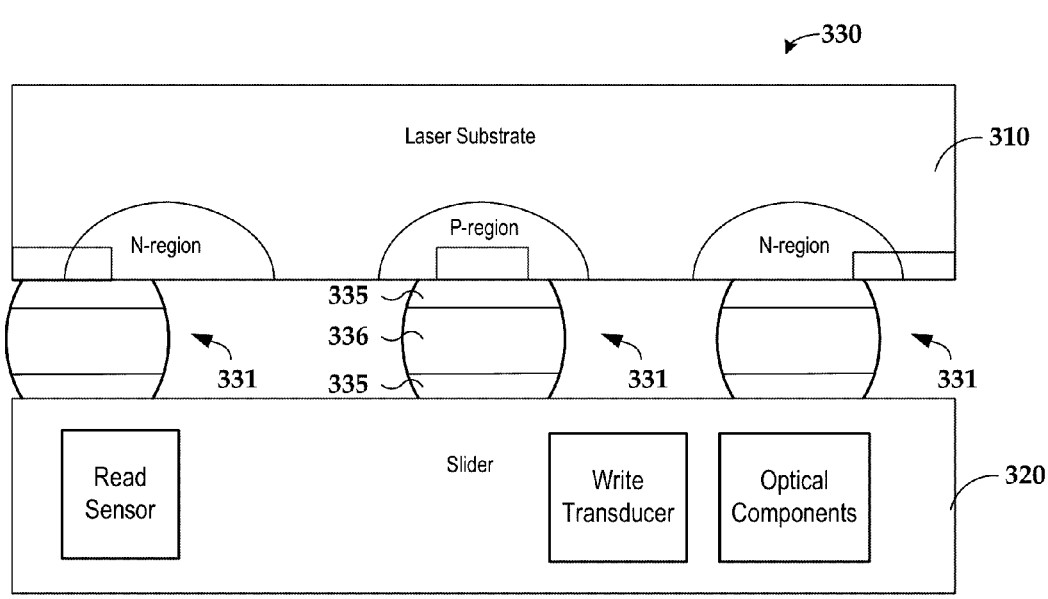

FIG. 3C shows the solder connections 331 of the assembly 330 after the laser 310 shown in FIG. 3A is soldered to the slider 320 shown in FIG. 3B. The solder bumps 306 of the contacts 311 have been melted and then allowed to cool and solidify, bonding the laser subassembly 310 to the slider 320. During the soldering process, the metallization stacks 305, 325 consume some of the solder of the solder bumps 306 forming intermetallic zones 335. A eutectic zone 336 of eutectic material is disposed between the intermetallic zones 335 of each solder connection 331.

As previously mentioned, a low temperature solder may be used in areas (such as the laser-slider interface) that cannot tolerate high heat due to the proximity of temperature sensitive components, such as the read sensor, for example. An Sn-based solder provides a low melting point temperature making it suitable for use in in low temperature soldering applications. In some configurations, the solder 330 used to couple the laser subassembly 310 to the slider 320 may include a high Sn content, for example, the solder may include Sn—Ag solder having a composition of about 96.5 wt. % Sn/3.5 wt. % Ag. Solder having this composition has a melting point of in a temperature range of a few degrees around 221° C.

Figure 4A:
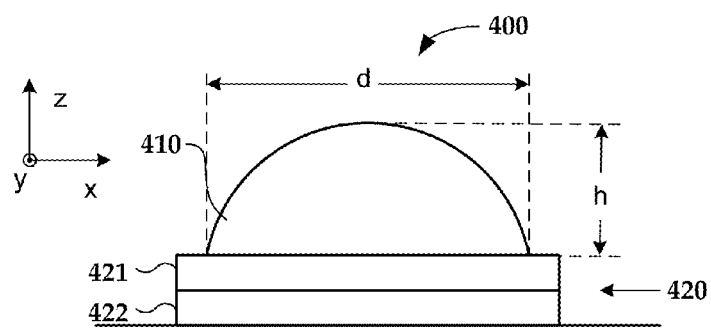
FIGS. 4A-4C show under bump metallizations (UBMs) in accordance with various embodiments.
Figure 4B:
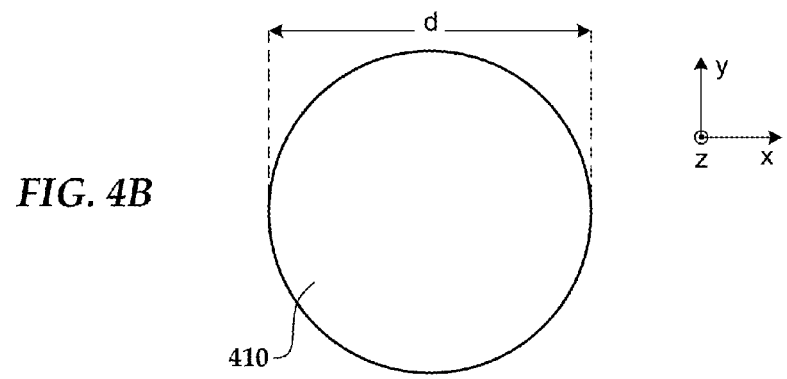
Figure 4C:
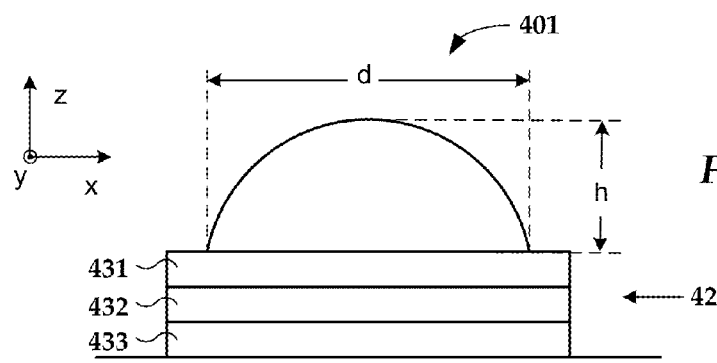
Figure 4D:
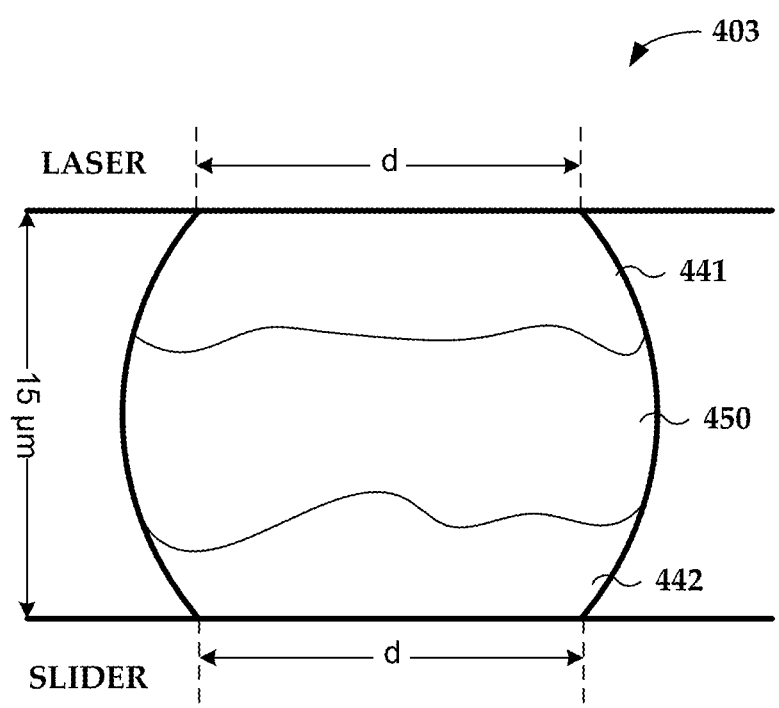
FIG. 4D depicts a solder connection after reflow soldering according to embodiments discussed herein.

FIGS. 4A-4C show aspects of metallization stacks suitable to form soldered connections that have a volume/area less than about 15 µm. FIG. 4D illustrates a cross section of a solder connection after the soldering is complete. FIG. 4A shows a cross section of a solder contact 400 comprising a solder bump 410 and UBM 420 having two layers 421, 422 prior to soldering.

In example shown in FIG. 4A, the UBM 420 includes first and second layers 421, 422. As previously discussed, the composition, arrangement and/or thicknesses of the UBM layers can be selected to achieve eutectic zone comprising a eutectic material that occupies at least about 35% of the total volume/area of the solder connection, where the total volume/area may be about 15 μm. A eutectic zone of at least 35% of the total volume/area of the solder connection limits the structurally weaker intermetallic zones that occur on either side of the eutectic zone to a total volume/area of the solder connection equal to or less than about 65%. In a particular embodiment, the first UBM layer 421 is a wetting layer, e.g., an Au layer, e.g., having a thickness less than about 1000 Å, and the second UBM layer 422 is a Pt layer, e.g., having a thickness between about 300 Å to about 3000 Å. FIG. 4B shows a top view of the solder bump 410. Although FIGS. 4A-4C show a circular contact, it will be appreciated that the solder contact may have any shape, e.g., square, rectangular, etc.

FIG. 4C depicts a solder contact 401 that includes a solder bump and a multi-layer UBM 430 that includes first, second, and third metallization layers 431, 432, 433. In a particular embodiment, the first metallization layer 431 is a wetting layer, e.g., Au, having a thickness less than about 1000 Å, the second metallization layer 432 is a diffusion barrier layer, e.g., Pt, having a thickness between about 300 Å to about 3000 Å, and a third metallization layer 433 may comprise an adhesion layer, such as chrome or Ti, having a thickness between about 100 Å to about 500 Å, or in a range of about 200 Å and 300 Å, for example. Additional layers may be included in the UBM. For example in a particular embodiment, the UBM includes an Ni layer between the Au layer 431 and the Pt layer 432 and having a thickness between about 300 Å to about 3000 Å. In some embodiments the UBM may include a Cu layer, e.g., between the Au layer and the Pt layer, and having a thickness less than about 1000 Å. In some embodiments, the assembly may include additional layers may be disposed below the adhesion (Ti) layer, which are not part of the UBM. For example, in some embodiments, the assembly may include a relatively thick Au or Ni layer may be disposed below the Pt and Ti layers. However, these additional layers are not part of the UBM and do not interact with the solder during the soldering process. The Pt and/or Ti layers serve to keep these thicker layers from consuming the solder during the reflow solder process.

FIG. 4D illustrates a soldered connection 403 after the contacts of FIG. 4A or 4B are soldered. In some implementations, the contacts (e.g., as shown in FIG. 4A or 4C) can be soldered to mating contacts having similar UBM. In some implementations, the contacts (e.g., as shown in FIG. 4A or 4C) can be soldered to mating contacts having different metallization and/or dimensions.

In a particular embodiment, similar mating contacts are disposed on a laser (or other electronic device) and a slider (or other substrate). The soldered connection 403 has a total volume/surface area less than or equal to about 15 μm, less or equal to about 10 μm, less than or equal to about than about 8 μm, or even less or equal to about 4 μm. The soldered connection 403 includes first and second intermetallic zones 441, 442 proximate to the laser and slider, respectively. A eutectic zone 450 comprising eutectic material is disposed between the intermetallic zones 441, 442. The eutectic zone 450 occupies greater than or equal to about 35% of the total volume/area of the solder connections. The intermetallic zones collectively occupy less than or equal to about 65% of the total volume/area of the solder connection. Thus, for a soldered connection having a total volume/area of about 15 μm, the eutectic zone occupies about 5.25 μm of the total volume/area of the solder connection and the intermetallic zones collectively occupy about 9.75 μm of the total volume/area of the solder connection. For a soldered connection having a total volume/area of about 10 μm, the eutectic zone occupies about 3.5 μm of the total volume/area of the solder connection and the intermetallic zones collectively occupy about 6.5 μm of the total volume/area of the solder connection. For a soldered connection having a total volume/area of about 8 μm, the eutectic zone occupies about 2.8 μm of the total volume/area of the solder connection and the intermetallic zones collectively occupy about 5.2 μm of the total volume/area of the solder connection. For a soldered connection having a total volume/area of about 4 μm, the eutectic zone occupies about 1.4 μm of the total volume/area of the solder connection and the intermetallic zones collectively occupy about 2.6 μm of the total volume/area of the solder connection.

Figure 5A:
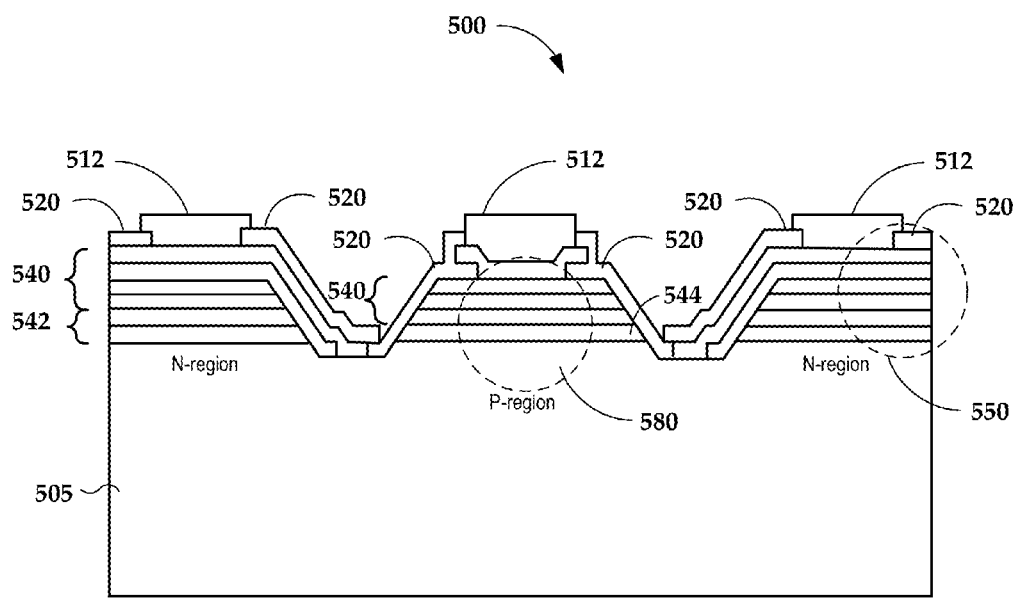
FIG. 5A illustrates a more detailed view of solder bumps and UBM in accordance with some embodiments.

FIG. 5A illustrates a more detailed view of a laser diode 500 that includes solder contacts having under bump metallization (UBM) compatible with low volume/area solder connections comprising an Sn-based solder, e.g., Sn 96.5 wt. %/Ag 3.5 wt. %, in accordance with various embodiments described herein. Although this example shows the UBM for low volume/area solder connections disposed on a laser diode, it will be appreciated that the same or similar mating solder contact, e.g., having the same or similar UBM could also be disposed on the slider. The laser diode 500 includes various semiconductor layers disposed on a substrate 505 that collectively form a light emitting device. Electrical contact is made to N and P-type semiconductor regions of the laser diode 500 through solder bumps 512 disposed on UBMs 540. For protection and electrical isolation, the UBMs 540 are partially covered by one or more insulator layers 520, as shown. A UBM 540 is disposed on each of the N and P-metal stacks 542, 544 of the laser diode 500. The N- and P metal layers can be selected to enhance current flow through N and P regions of the diode.

Figure 5B:
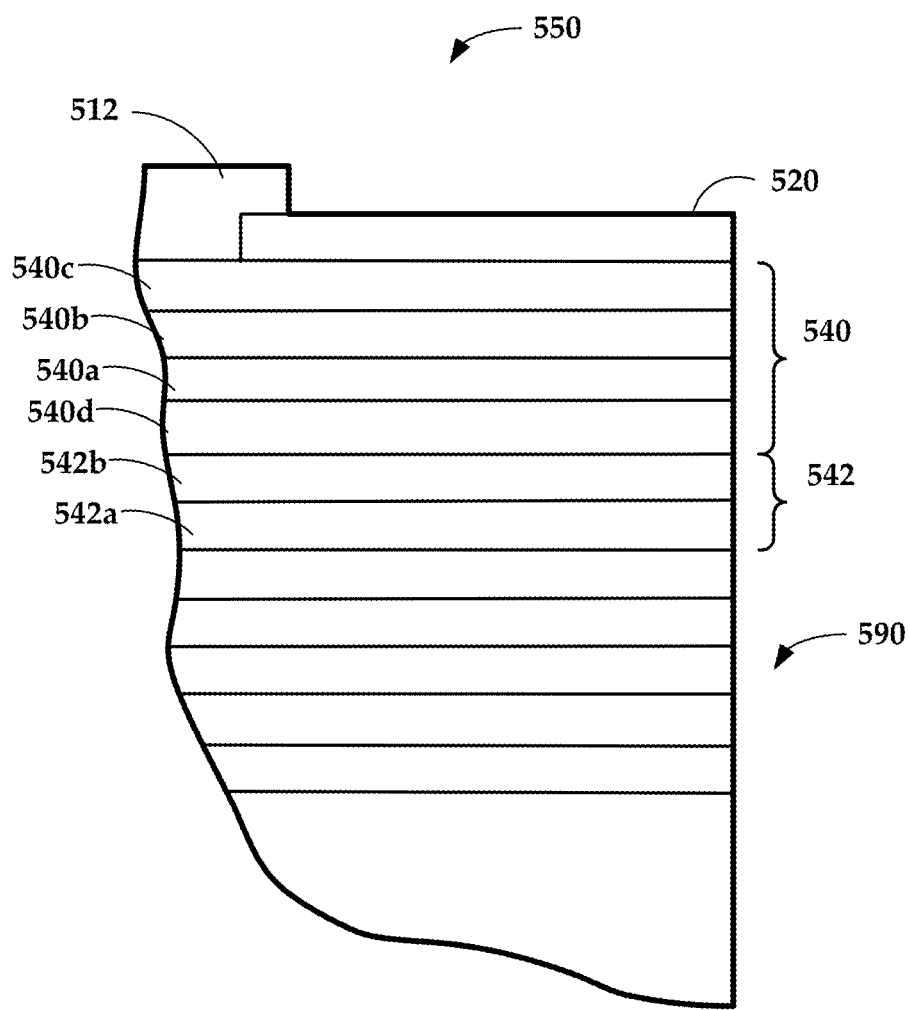
FIG. 5B shows an expanded view of the UBM and the N-metal stack.

An expanded view of Portion 1 550 of the laser diode 500 is shown in FIG. 5B. The expanded view shows the UBM 540 that is compatible with a low volume/area solder connection comprising an Sn-containing eutectic material, and the N-metal stack 542. In this particular embodiment, the UBM 540 includes a number of layers 540a-c, including a thin Au layer 540c disposed directly under a solder bump 512 and having a thickness of about 1000 Å or less, e.g., about 200 Å, a Pt layer 540a, and an Ni layer 540b disposed between the Au layer 540c and the Pt layer 540a. In some implementations, the Pt layer 540a has a thickness in a range of about 300 Å to about 3000 Å, e.g., about 1000 Å, and the Ni layer 540b has a thickness in a range of 300 Å to about 3000 Å, e.g., about 1200 Å. The UBM further includes a Ti layer having a thickness of about 400 Å, which provides an adhesion layer between the UBM metallization and the N metal stack 542.

Figure 5C:
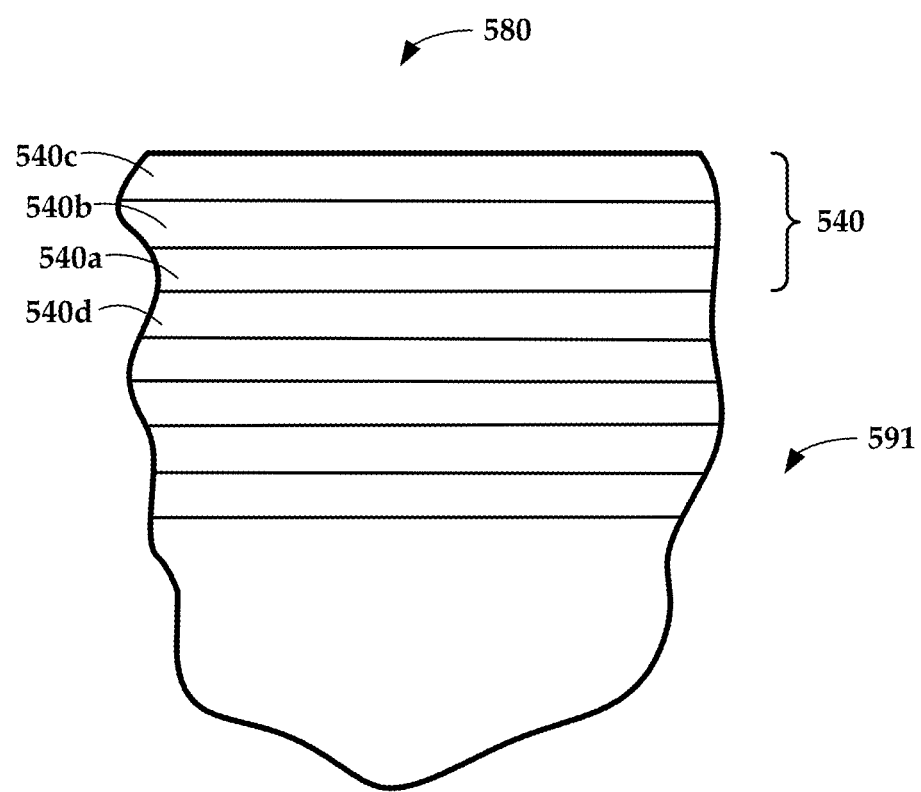
FIG. 5C is an expanded view of the UBM and the P-metal stack.

The N metal stack 542 of the laser diode is adjacent to the UBM 540 and between the metallization stack 540 and the N-type semiconductor regions 590 of the diode. In this particular example, the N metal stack 542 includes a Ge layer having a thickness of about 1000 Å, and a Pd layer having a thickness of about 300 Å. The Au in the metallization stack 540 is excluded entirely or is very thin to prevent the Au from reacting with the solder during the reflow solder process to form a large, structurally weak intermetallic zone. However, additional Au and/or other metals may be disposed under the Pt and/or Ti UBM layers, e.g., where "under" in this context means farther from the solder bump 512. The Pt and/or Ti layers prevent the metals under the Pt and/or Ti layers from substantially interacting with the solder to form large intermetallic zones Turning back to FIG. 5A, an expanded view of Portion 2 580 of the laser diode subassembly 500 is shown in FIG. 5C. Portion 2 580 shows the UBM 540 and P-metal stack 544 which is disposed over the P region of the laser diode. As in FIG. 5B, the metallization stack 540 in FIG. 5C includes an Au layer 540c, an Ni layer 540b, a Pt layer, 540a, and a Ti layer 540 which may have thicknesses within the ranges previously disclosed. For example, in a particular embodiment, the Au layer 540c has a thickness of about 200 Å, the Pt layer 540a has a thickness of about 1000 Å, the Ni layer 540b, which is disposed between the Au 540c and Pt layers 540a has a thickness of about 1200 Å. The Ti layer 540d has a thickness of about 400 Å. As previously discussed, the UBM 540 includes only a very thin Au layer 540c above the Pt layer 540a, and in some configurations the Au layer above the Pt layer may be eliminated altogether.

Figure 6:
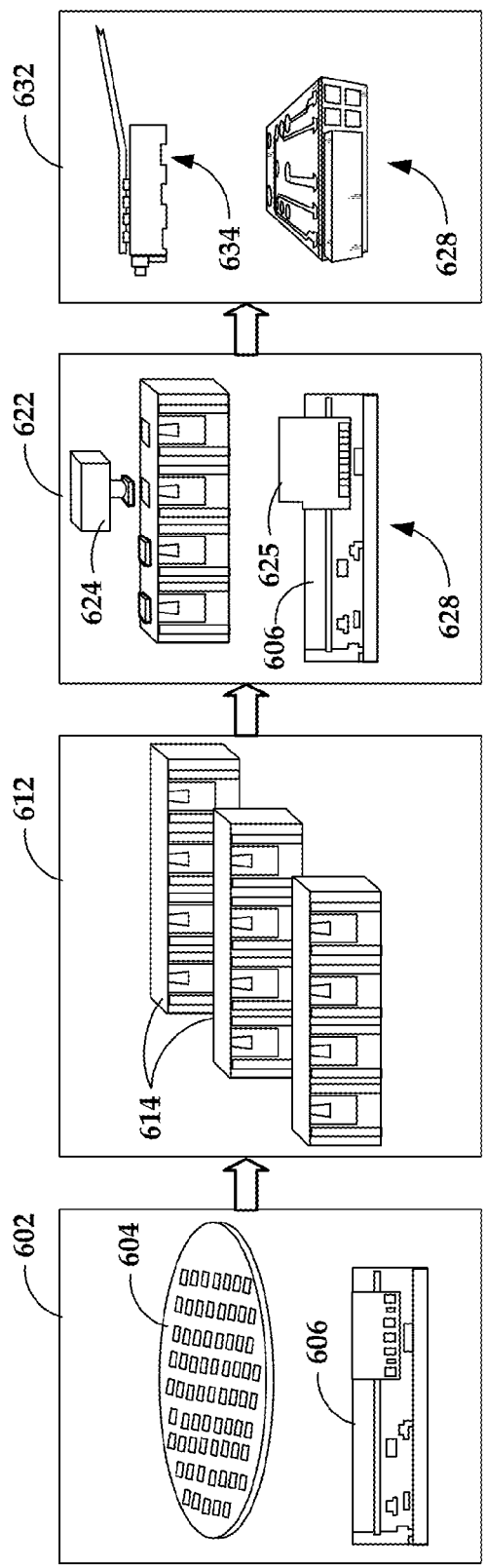
FIG. 6 shows a process flow diagram that illustrates a high-level, short summary of a bar-level laser attach with protruding edge-emitting laser diode (EELD) according to an example embodiment.

FIGS. 6 and 7 describe processes for manufacturing a slider assembly according to embodiments described herein. In reference now to FIG. 6, a process flow diagram illustrates a high-level, short summary of a bar-level laser attach with protruding edge-emitting laser diode (EELD) according to an example embodiment. Block 602 represents a wafer-level stage. A wafer 604 is formed using semiconductor manufacturing processes (e.g., thin film deposition, chemical-mechanical polishing/planarization, etc.) and each wafer 604 generally includes a plurality of sliders (e.g., slider 606) that are later cut into bars for further processing. As previously discussed, the sliders 606 include a cavity for laser mounting via a solder array. A sacrificial protection material may be placed in the cavity to protect the solder array. The slider 606 is also includes various optical coupling and light positioning elements as previously discussed.

Block 612 represents an upstream stage where the wafer 604 has been cut into bars 614. Each bar 614 includes a plurality of sliders that are batch-processed. This stage 612 may involve attaching top bond pads (e.g., part of a slider-gimbal electrical interface) and performing electrical tests before attachment of lasers. Block 622 represents a bar-level laser attach stage. This stage 622 may involve removing sacrificial cavity fill material, and attaching the lasers. The lasers (e.g. laser diode 625) may be placed on the bars using a pick-and-place machine 624, and thereafter bonded to the slider (e.g., slider 606) via a reflow operation (e.g., application of heat to melt the solder bumps) to form assembly 628. The lasers and/or slider may include solder contacts having UBMs compatible for use with low volume/area solder connections. The solder used may comprise a low temperature solder as previously discussed. This stage 622 may also involve encapsulating the laser 625 and laser-cavity interface, and performing post-attachment laser electrical/optical tests of the assembly 628.

Block 632 represents a stage for forming a modified dice and top bonding pad (TBP) head-gimbal assembly (HGA). Generally, this stage 632 may utilize standard TBP/HGA practices, except that tooling may need to be modified to account for the geometry of the integrated laser/slider assembly 628. Also, an optical test may be performed on the completed head-gimbal assembly 634 in addition to other tests performed on sliders in general (e.g., magnetic transfer curve response, electrical performance, etc.).

Figure 7A:
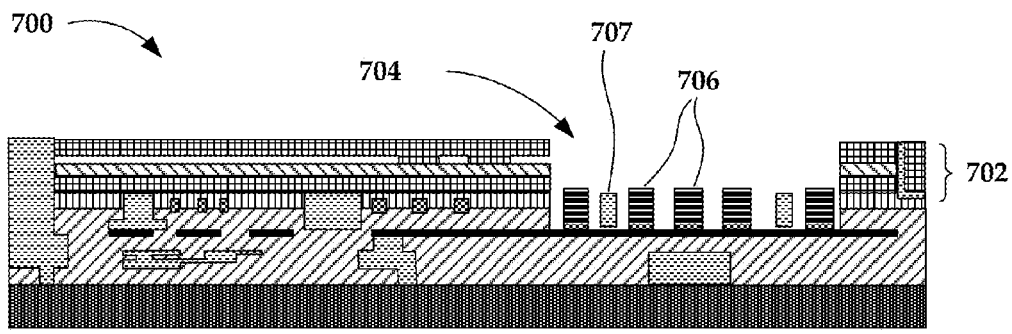
FIG. 7A shows a cross sectional diagram of the wafer after a number of other processing steps have been performed.

In FIG. 7A, a cross sectional diagram shows the wafer 700 after a number of other processing steps (not shown) have been performed. Those steps include formation of the optical layers 702, removal of sacrificial material to form the cavity 704, and deposition of UBMs and low volume solder micro bumps 706. The final portion of the cavity 704 is formed during the stud forming process (not shown). The cavity 704 can be slightly larger than the cavity below to ensure that critical alignment features (e.g., lateral mechanical stopper features) are defined by the precise cavity etch of the optical layers 702, and not the final stud plating step (not shown).

In order to maintain good optical properties where the layers 702 meet the cavity 704, fill material may be something that is easily removed by a wet-etch (such as copper) or a dry process such as that will not affect the edges of the waveguide. The optical materials of the layers 702 should also be chosen for good profile control and optical qualities. For example, SiONx may be used as a core material in some embodiments because this material etches fairly comparably to a surrounding alumina cladding, alumina being a material commonly used for this purpose.

Figure 7B:
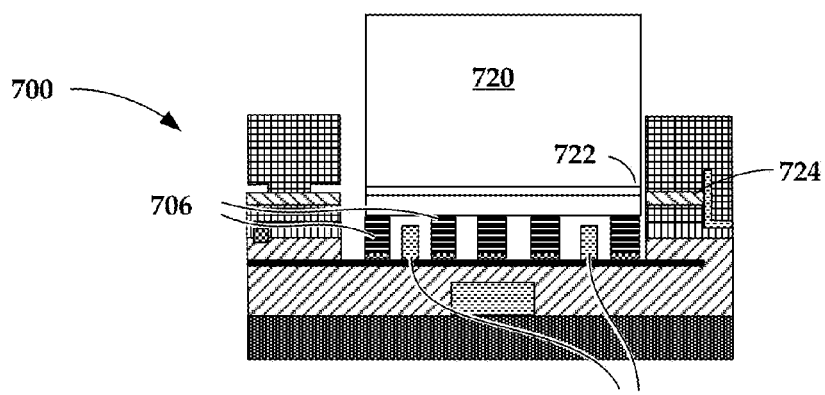
FIGS. 7B-7C illustrate cross sectional views of alignment of an edge-emitting laser diode and a slider, the laser diode having the metallization stack as discussed in embodiments herein.
Figure 7C:
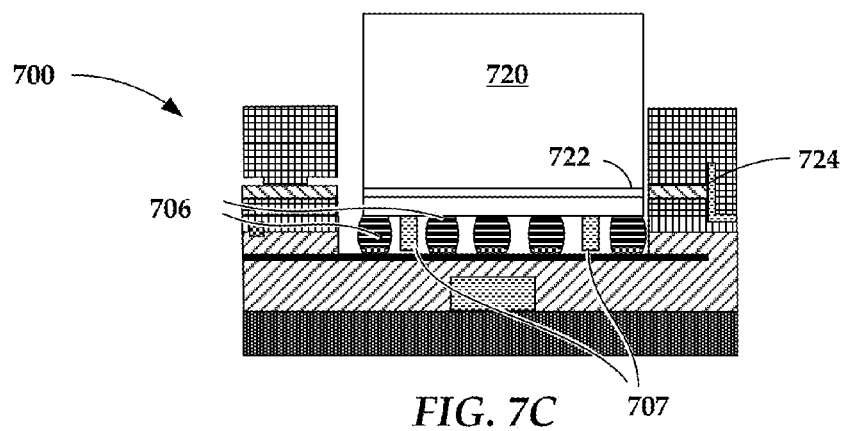

An example of alignment of an edge-emitting laser diode 720 in the cavity 704 is shown in cross sectional views of FIGS. 7B and 7C. In FIG. 7B, the laser diode 720 has been tacked into position following, e.g., a pick and place operation on a wafer, chunk, and/or bar assembly. At this stage, there may be a gap between the laser 720 and the vertical stoppers 707 due to the solder bumps 706 being higher than the stops 707. At this point, an output facet 722 of the laser 720 may be misaligned with the waveguide core 724. In FIG. 7C, the configuration after a reflow operation has been performed. At this stage, the solder bumps 706 have been reshaped due to the reflow, and the laser 720 contacts the stops 707. This results in proper vertical alignment between the output facet 722 and core 724. The use of many fine pitch, low volume solder micro bumps facilitates the alignment of the laser to the waveguide core as surface tension between the mating contacts during the reflow process pulls the laser into alignment with the core and into contact with the stoppers.

Figure 8:
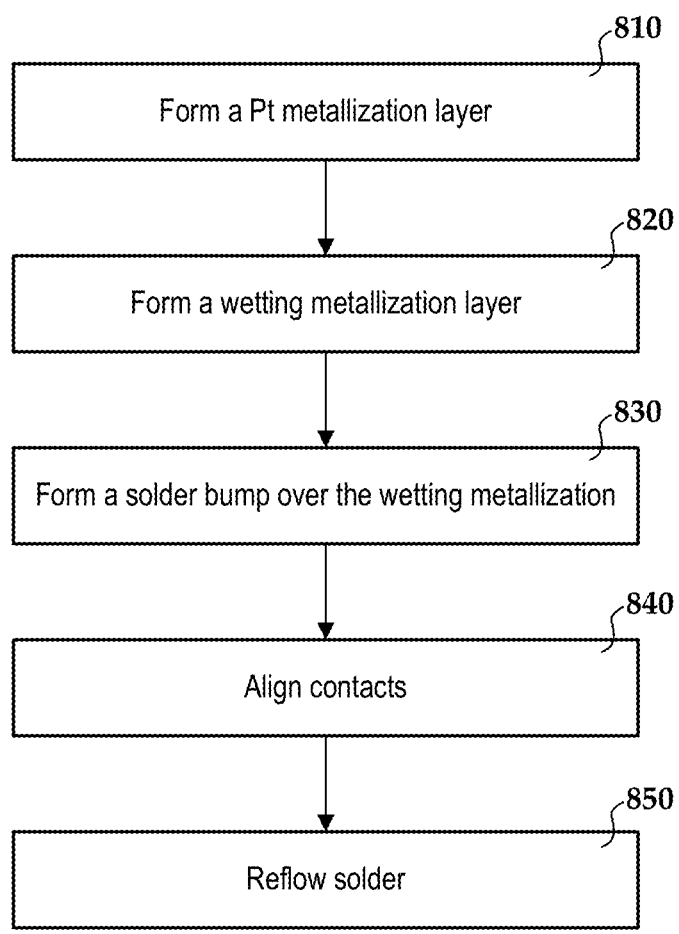
FIG. 8 is a flow diagram that illustrates processes of forming solder connections according to some embodiments.

FIG. 8 is a flow diagram that illustrates processes of forming solder connections according to some embodiments, A contact is formed by depositing 810 a Ti metallization having a thickness between 100 Å and 500 Å and a Pt metallization layer having a thickness between about 300 Å to about 3000 Å. For example, the solder contact may be formed on a laser diode or slider. A wetting metallization layer is deposited 820 on the Pt layer. In a particular embodiment, the wetting metallization layer may comprise an Au layer having a thickness less than about 1000 Å. The wetting metallization layer forms good wetting contact between the metallization layers below and a solder bump which is formed 830 over the wetting metallization layer. The solder contact is aligned 840 with a mating contact and is reflow soldered 850. The reflow soldering produces a soldered connection having a total volume/area of less than about 15 μm and having a first intermetallic zone adjacent to the laser diode, a second intermetallic zone adjacent to the slider, and a eutectic zone of eutectic material disposed between the first and second intermetallic zones, the eutectic zone occupying about 35% of a total volume/area of the solder connection.

Figure 9:
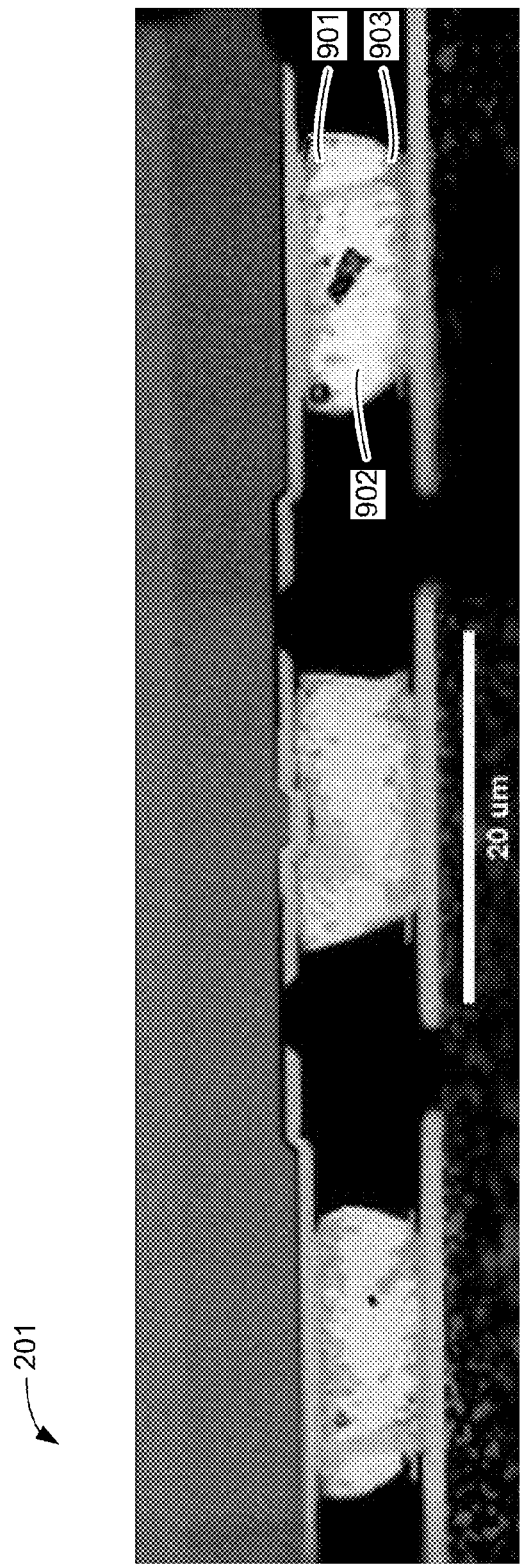
FIG. 9 shows an image of a cross section of solder connections in accordance with an embodiment.

FIG. 9 is an image of a cross section of solder connections in accordance with an embodiment. FIG. 9 shows the top and bottom intermetallic zones 901, 903 adjacent to the laser and substrate respectively as darker color. The lighter color eutectic zone 902 is disposed between the intermetallic zones 901, 903.

Figure 10:
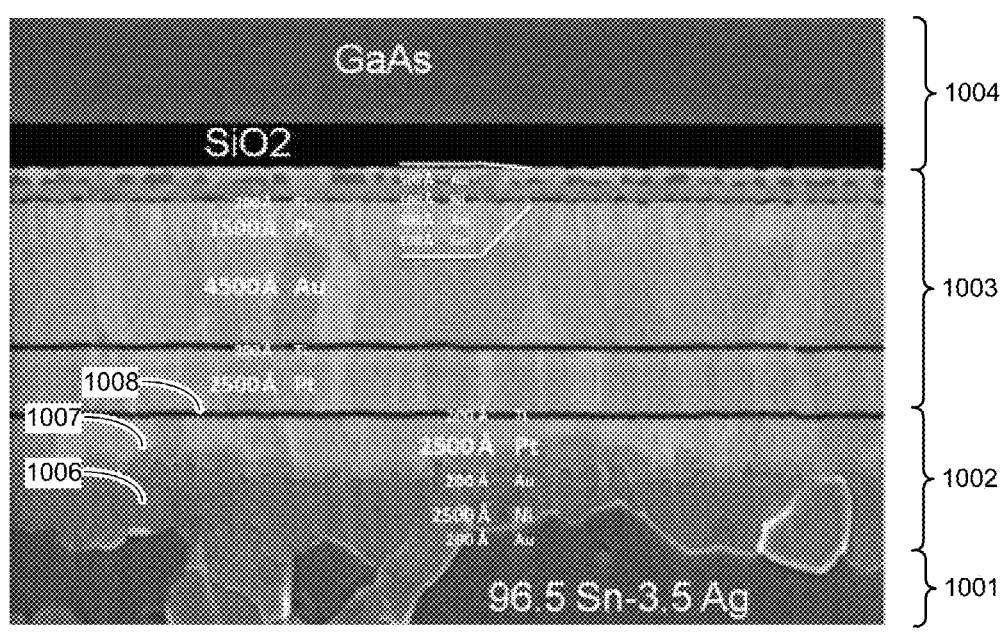
FIG. 10 shows an image of a high resolution cross section of solder connection in accordance with an embodiment.

FIG. 10 is an image of a high resolution cross section of a solder connection in accordance with an embodiment. In this example, the solder connection is on a laser diode. The high resolution image shows the eutectic zone 1001 comprising a Sn-containing eutectic material. During the solder process an intermetallic zone 1002 was formed between the eutectic zone 1001 and the N metal layers 1003 disposed on the laser diode substrate 1004. The intermetallic zone includes a portion 1006 that comprises Au and Ni. The predominantly Pt region 1007 of the intermetallic zone 1002 is discernible as well as the Ti layer 1008. Note that additional metal layers are arranged between the Ti layer 1008 and the laser substrate 1004. However, these layers do not interact during the reflow solder process and do not contribute to the intermetallic zones formed by reflow soldering.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A heat assisted magnetic recording (HAMR) assembly, comprising;
   a slider comprising read and write transducers;
   a laser diode;
   solder connections between the laser diode and the slider that mechanically and electrically attach the laser diode to the slider, each solder connection having a surface area at the laser diode of less than about 300 $\mu m^2$, a surface area at the slider of less than about 300 $\mu m^2$, a total volume per unit area of less than or equal to 8 $\mu m$, and having a first intermetallic zone adjacent to the laser diode, a second intermetallic zone adjacent to the slider, and a eutectic zone of eutectic material between the first and second intermetallic zones, the eutectic zone occupying greater than or equal to about 35% of the total volume per unit area of the solder connection.

2. The assembly of claim 1, wherein the eutectic material is an Sn-containing eutectic material.

3. The assembly of claim 2, wherein the eutectic material is Sn—Ag or Au—Sn.

4. The assembly of claim 1, wherein the eutectic material is about 96.5 wt. % Sn and about 3.5 wt. % Ag.

5. The assembly of claim 1, wherein the eutectic material is about 90 wt. % Au and about 10% Sn.

6. The assembly of claim 1, wherein the volume per unit area is less than or equal to about 4 $\mu m$.

7. An assembly, comprising:
   a substrate;
   an electronic component;
   solder connections between the electronic component and the substrate that mechanically and electrically attaches the electrical component to the substrate, at least one of the solder connections having a surface area at the electronic component of less than about 300 $\mu m^2$, and a surface area at the substrate of less than about 300 $\mu m^2$, a total volume per unit area of less than or equal to about 8 $\mu m$ and having a first intermetallic zone adjacent to the electronic component, a second intermetallic zone adjacent to the substrate, and a eutectic zone of eutectic material between the first and second intermetallic zones, the eutectic zone occupying greater than or equal to about 35% of the total volume per unit area of the solder connection.

8. The assembly of claim 7, wherein the eutectic material is an Sn-containing eutectic material.

9. The assembly of claim 7, wherein the volume per unit area is less than or equal to about 4 $\mu m$.

10. The assembly of claim 1, wherein each solder connection has a volume of less than about 1000 $\mu m^3$.

11. The assembly of claim 1, wherein the eutectic material has a melting temperature in the range of about 220° C. to about 250° C.

12. The assembly of claim 1, wherein the eutectic material has a melting point of in a temperature range of a few degrees around 221° C.

13. The assembly of claim 1, wherein the first and second intermetallic zones have combined volume per unit area of no more than about 65%.

14. The assembly of claim 7, wherein the eutectic material is Sn—Ag or Au—Sn.

15. The assembly of claim 7, wherein the eutectic material is about 96.5 wt. % Sn and about 3.5 wt. % Ag.

16. The assembly of claim 7, wherein the eutectic material is about 90 wt. % Au and about 10% Sn.

17. The assembly of claim 7, wherein each solder connection has a volume of less than about 1000 $\mu m^3$.

18. The assembly of claim 7, wherein the eutectic material has a melting temperature in the range of about 220° C. to about 250° C.

19. The assembly of claim 7, wherein the eutectic material has a melting point of in a temperature range of a few degrees around 221° C.

20. The assembly of claim 7, wherein the first and second intermetallic zones have combined volume per unit area of no more than about 65%.

* * * * *